(12) United States Patent
Yun et al.

(10) Patent No.: US 10,163,525 B2
(45) Date of Patent: Dec. 25, 2018

(54) TEST APPARATUS BASED ON BINARY VECTOR

(71) Applicant: Samsung Electronics Co., Ltd., Suwon-si, Gyeonggi-do (KR)

(72) Inventors: Joosung Yun, Asan-si (KR); Seongseob Shin, Asan-si (KR); Moon-Ho Lee, Asan-si (KR); Woonsup Choi, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 20 days.

(21) Appl. No.: 15/456,195

(22) Filed: Mar. 10, 2017

(65) Prior Publication Data

US 2017/0337988 A1 Nov. 23, 2017

(30) Foreign Application Priority Data

May 17, 2016 (KR) ........................ 10-2016-0060361

(51) Int. Cl.
*G11C 29/56* (2006.01)
*G01R 31/28* (2006.01)
*G11C 29/48* (2006.01)
*H04B 1/30* (2006.01)

(52) U.S. Cl.
CPC .... *G11C 29/56016* (2013.01); *G01R 31/2851* (2013.01); *G11C 29/48* (2013.01); *G11C 29/56012* (2013.01); *G11C 2029/5602* (2013.01); *H04B 2001/305* (2013.01)

(58) Field of Classification Search
CPC ......... G11C 29/42; G11C 29/52; G11C 29/56; G11C 29/56016; G01R 31/318513; G01R 31/318566; G01R 31/21903; G01R 31/8572; G01R 31/2851
See application file for complete search history.

(56) References Cited

U.S. PATENT DOCUMENTS

| | | | | |
|---|---|---|---|---|
| 7,143,324 | B2 * | 11/2006 | Bratt .............. | G01R 31/318547 714/726 |
| 7,363,557 | B2 * | 4/2008 | Evans .............. | G01R 31/31903 324/756.01 |
| 7,496,820 | B1 | 2/2009 | Theron et al. | |
| 8,170,828 | B2 | 5/2012 | McNamara et al. | |
| 8,225,156 | B1 | 7/2012 | Tabatabaei et al. | |
| 8,533,545 | B2 | 9/2013 | Goyal et al. | |
| 9,411,700 | B2 | 8/2016 | Lee | |
| 2010/0313089 | A1 * | 12/2010 | Rajski ............ | G01R 31/318547 714/731 |
| 2012/0324302 | A1 * | 12/2012 | Arslan ........... | G01R 31/318572 714/727 |

(Continued)

FOREIGN PATENT DOCUMENTS

| | | |
|---|---|---|
| JP | 4577154 B2 | 9/2010 |
| JP | 2012-118001 A | 6/2012 |
| KR | 10-2000-0033312 A | 6/2000 |

(Continued)

*Primary Examiner* — Shelly A Chase
(74) *Attorney, Agent, or Firm* — Myers Bigel, P.A.

(57) ABSTRACT

A test apparatus includes a device under test (DUT) configured to exchange data using a serial interface protocol and a test controller configured to receive a binary vector corresponding to a physical layer of the serial interface protocol from an external device and to buffer and transmit the received binary vector to the DUT.

15 Claims, 9 Drawing Sheets

(56) References Cited

U.S. PATENT DOCUMENTS

2014/0236526 A1    8/2014   Frediani et al.

FOREIGN PATENT DOCUMENTS

| KR | 10-0436207 B1 | 6/2004 |
| KR | 10-0735670 B1 | 6/2007 |
| KR | 10-0914174 B1 | 8/2009 |
| KR | 10-1087182 B1 | 11/2011 |

* cited by examiner

TEST APPARATUS BASED ON BINARY VECTOR

CROSS-REFERENCE TO RELATED APPLICATIONS

This U.S. non-provisional patent application claims priority under 35 USC § 119 to Korean Patent Application No. 10-2016-0060361 filed on May 17, 2016, the entirety of which is hereby incorporated by reference.

BACKGROUND

Example embodiments of inventive concepts relate generally to test apparatuses and, more particularly, to test apparatuses that are capable of testing memory devices of various interface protocols.

A test board or a test apparatus may include a test controller specialized in a semiconductor device to test a semiconductor device manufactured after a package process. The semiconductor device may be removable from the test board or the test apparatus. When the semiconductor device is mounted on the test board during a test, the test controller may decode a command or data provided from an external entity (e.g., ATE) and may transmit a result of the decoding to the semiconductor device. As a result, an interface of the test controller for performing the test may depend on an interface protocol of the semiconductor device.

The test controller may be specialized in a specific protocol applied to the semiconductor device under test. Accordingly, the test controller may be replaced to test a semiconductor device associated with another protocol. For example, a chip to perform a function of the test controller may be replaced. When the test controller is configured with a field programmable gate array (hereinafter referred to as "FPGA"), a new programmed FPGA may be provided to test the semiconductor device for another interface protocol.

Under a test environment of mass-produced semiconductor devices, lots of time and efforts are required to develop various test controllers. In addition, a general-purpose interface protocol solution is used to flexibly correspond to the test quantity requested.

SUMMARY

The present disclosure relates to a general-purpose test apparatus, which is not dependent on an interface protocol of a semiconductor device that is a test target.

A test apparatus according to example embodiments of inventive concepts may include a device under test (DUT) configured to exchange data using a serial interface protocol and a test controller configured to receive a binary vector corresponding to a physical layer of the serial interface protocol from an external device and to buffer and transmit the received binary vector to the DUT.

A general-purpose test apparatus according to example embodiments of inventive concepts may include a test controller configured to translate received binary data into a serial transmission signal, a device under test (DUT) configured to receive the serial transmission signal from the test controller via a differential signal line pair, and a DC offset block configured to adjust a DC offset of the differential signal line pair in response to a DC offset control signal from the test controller. The DC offset block may include at least one passive element.

A test apparatus according to example embodiments of the inventive concepts may include a test controller that is configured to communicate with a device under test (DUT) using a multi-layer test protocol and an automated test equipment unit that is coupled to the test controller. The automated test equipment unit is configured to implement at least one layer of the multi-layer test protocol and the test controller is configured to implement remaining layers of the multi-layer test protocol other than the at least one layer of the multi-layer test protocol implemented by the automated test equipment.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are explained in detail in the specification set forth below.

BRIEF DESCRIPTION OF THE DRAWINGS

The forgoing and other features of inventive concepts will be described below in more detail with reference to the accompanying drawings of non-limiting example embodiments of inventive concepts in which like reference characters refer to like parts throughout the different views. The drawings are not necessarily to scale, emphasis instead being placed upon illustrating principles of inventive concepts. In the drawings.

DETAILED DESCRIPTION

The term "binary vector" used herein refers to data corresponding to a physical layer of an interface protocol between a test controller and a device under test (DUT). That is, the binary vector refers to a sequence of binary data provided to the device under test (DUT) to perform a test. In general, a command or various data are provided to perform a test. However, the command or the data may be converted into a command or data of a transaction layer or a link layer of an interface protocol. Hereinafter, a conversion-completed vector will be referred to as a binary vector. Accordingly, if the binary vector is received in a device under test (DTU), although it is stored in a buffer and is transmitted through a serial interface by a driver, a requested operation may be performed.

Example embodiments of the inventive concepts will now be described with respect to a test board or a test apparatus for testing a semiconductor memory device. However, it is to be understood that a test apparatus according to example embodiments of the inventive concept may be applied to techniques for testing not only semiconductor memory devices but also various semiconductor devices, such as an application processor and ASIC.

Figure 1:
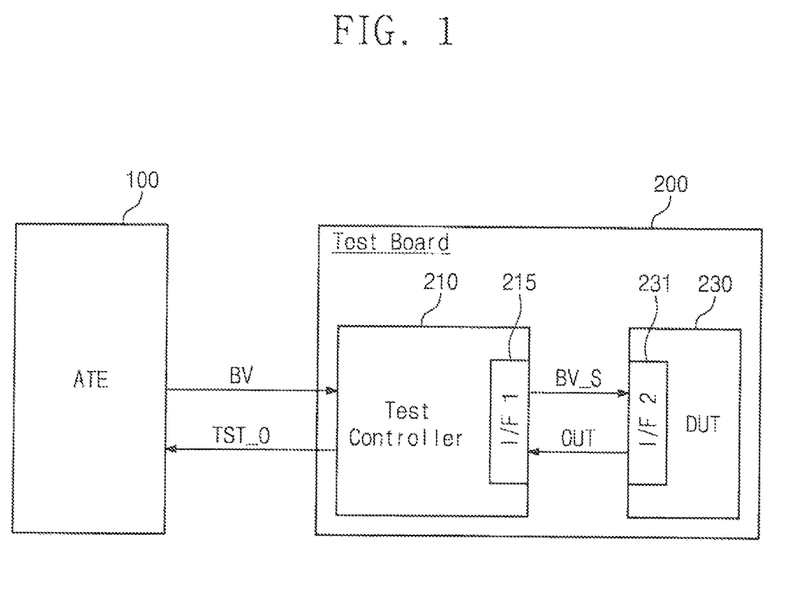
FIG. 1 is a block diagram of a test system according to example embodiments of the inventive concepts.

FIG. 1 is a block diagram of a test system according to example embodiments of the inventive concepts. As illustrated, the test system includes an automated test equipment (ATE) 100 and a test board 200. The test board 200 may include a test controller 210 and a removable device under test (DUT) 230. Hereinafter, the test board 200 will be referred to as a test apparatus.

The ATE 100 generates a binary vector BV, which is provided to the DUT 230. The ATE 100 generates a binary vector BV corresponding to an interface protocol of the DUT 230. For example, when the interface protocol used in the DUT 230 is the Universal Flash Storage (UFS) standard, the ATE 100 generates a binary vector decoded from a command of the UFS standard. That is, the ATE 100 generates a command or data to be transmitted to the DUT 230 as a binary vector BV corresponding to the interface protocol of the DUT 230 and transmits the command or the data to the test controller 210. Various interface protocols can be used including, but not limited to, the Peripheral Component Interconnect Express (PCIe), UFS, and Next Generation Form Factor (M.2) protocols or communication schemes. The procedure of generating the binary vector BV will be described below with reference to FIG. 2.

The controller 210 stores the binary vector BV generated by the ATE 100 in a buffer (not shown). The test controller 210 may convert the binary vector BV stored in the buffer into a serial signal BV_S transmitted through a signal line according to the interface protocol and may transmit the serial signal BV_S to the DUT 230. When an interface protocol between the test controller 210 and the DUT 230 is a serial transmission protocol, the test controller 210 may convert a buffered binary vector BV into the serial signal BV_S. The test controller 210 may accelerate the converted serial signal BV_S and may transmit the accelerated serial signal BV_S to the DUT 230 in a high-speed serial transmission manner. That is, the test controller 210 may serve to convert the binary vector BV provided from the ATE 100 to correspond to a physical layer transmission signal of the interface protocol. The test controller 210 serves to buffer the binary vector BV without separate decoding and serves to transmit the buffer binary vector BV using a first interface 215.

Additionally, the test controller 210 may receive output information DUT output from the DUT 230. The output information DUT may be a signal or data output in response to the serial signal BV_S. When the output information DUT indicates a test result, the test controller 210 may transmit the test result to the ATE 100. When the output information indicates whether the serial signal BV_S is received, the test controller 210 may retransmit the serial signal BV_S.

The DUT 230 receives the serial signal BV_S provided from the test controller 210 and performs an operation indicated by the received serial signal BV_S. The DUT 230 may provide the output information OUT to the test controller 210 as a result of an operation requested by the serial signal BV_S. The DUT 230 may include a second interface 231 for data exchange with the test controller 210. The second interface 231 may have a function of a physical layer defined in an MIPI M-PHY standard protocol. The second interface 231 may use an interface protocol having a link layer (e.g., UniPro) and a transaction layer (e.g., UFS). The DUT 230 may be a nonvolatile memory device having, for example, a high-speed serial interface.

Physical layers (PHY Layers) of the first interface 215 and the second interface 231 for providing an interface between the test controller 210 and the DUT 230 may be identical to each other. However, the ATE 100 may provide the function of the link layer or the transaction layer of the first interface 215. Thus, the test controller 210 may serve to transmit the binary vector BV provided from the ATE 100 as a physical signal of a protocol corresponding to an interface of the DUT 230.

In example embodiments, the physical layers of the first interface 215 and the second interface 231 may be defined by an "M-PHY" specification. The M-PHY is an interface protocol proposed by a mobile industry processor interface (MIPI) Alliance. However, inventive concepts are not limited to the above embodiments. As described below, the inventive concepts may be used in interface circuits that include a physical layer. The above embodiments are merely exemplary for better understanding of the inventive concepts.

According to the above-described test system, functions of the transaction layer, the link layer, and the like, which are dependent on the interface protocol of the DUT 230, may be performed by the ATE 100 instead of the test controller 210. Thus, the DUT 230 using the serial transmission protocol may be provided with improved universality.

Figure 2:
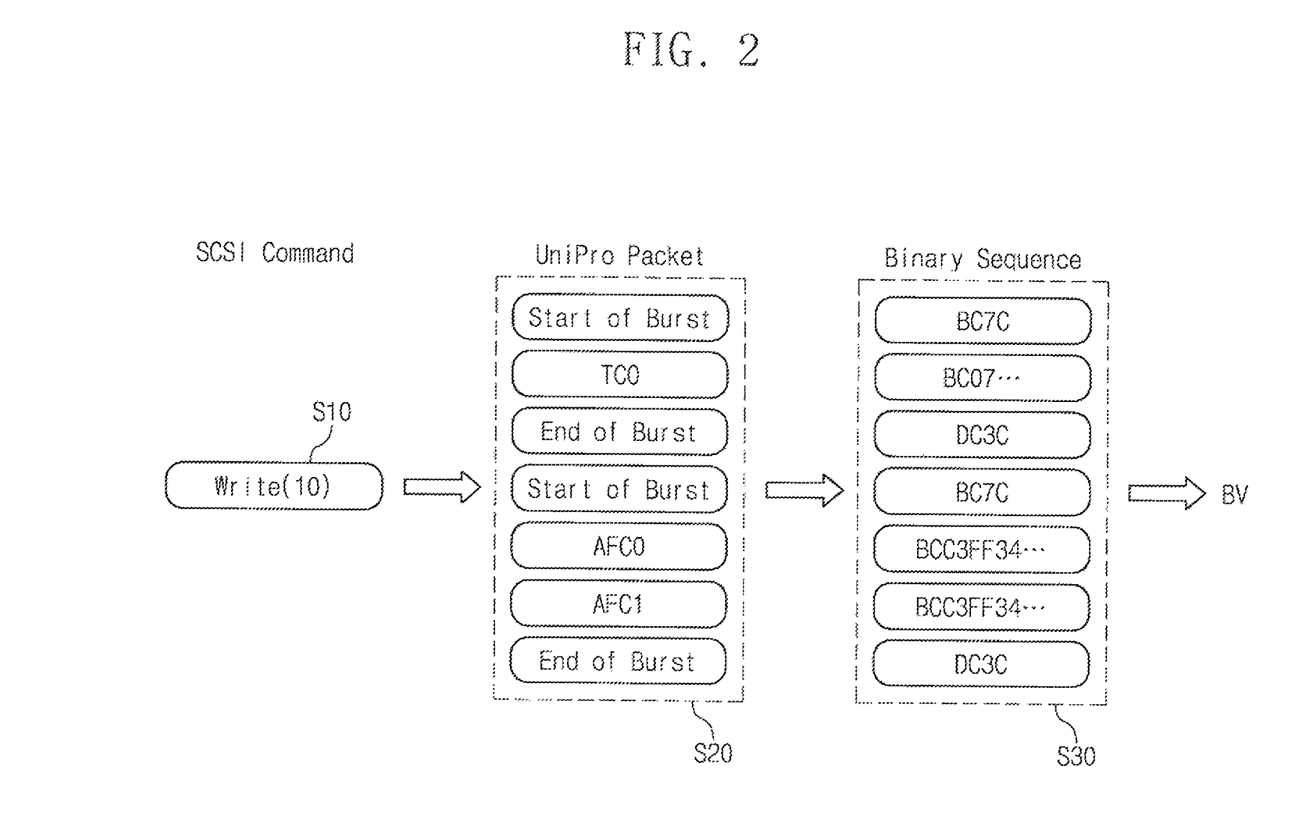
FIG. 2 illustrates a procedure of generating a binary vector in an ATE of FIG. 1.

FIG. 2 illustrates a procedure of generating a binary vector in the ATE 100 in FIG. 1. Referring to FIG. 2, the ATE 100 generates a command (e.g., Write(10)) having a specific purpose as a binary vector BV. This will now be described below in detail.

In S10, the ATE 100 generates the command Write(10) to be transmitted to the test board 200. The ATE 100 may generate various commands used in a specific test sequence. Among various command for test, the Write(10), which is an SCSI command, may be provided. The ATE 100 then performs an operation to translate a command to be transmitted into a binary vector BV based on an interface protocol.

In S20, the ATE 100 may convert the Write(10) into UniPro packets. For example, the ATE 100 may generate the Write(10) using a program to provide UniPro packets (Start of Burst, TCO, End of Burst, Start of Burst, AFC0, AFC1, and End of Burst) corresponding to the Write(10). An operation to convert the SCSI command into UniPro packets corresponds to a link layer operation of a UFS interface protocol.

In S30, the ATE 100 may translate fields corresponding to the UniPro packets Start of Burst, TCO, End of Burst, Start of Burst, AFC0, AFC1, and End of Burst into corresponding binary sequences BC7C, BC07 . . . , DC3C, DB7C, BCC3 . . . , BCC3 . . . , and DC3C, respectively. The conversion of the UniPro packets into binary codes may be performed according to a mapping defined in each interface protocol. The ATE 100 transmits the converted binary sequences BC7C, BC07 . . . , DC3C, BD7C, BCC3 . . . , BCC3 . . . , and DC3C to the test controller 210 as a binary vector BV.

The above description has been made regarding a function of the ATE 100 to generate a binary vector BV. A generation operation method of the binary vector BV may be determined according to an interface protocol of the DUT 230. As described above, a command is converted to the form of a binary signal transmitted to a physical layer. This means that change of a link layer or a transaction layer may be accommodated by changing a conversion algorithm in the ATE 100. Accordingly, when only the physical layer or only a signaling method matches, the test board 200 may test devices under test (DUTs) 230 of various interface protocols. As a result, a general-purpose test device may be implemented.

Although it has been described that generation of the binary vector BV is done in the ATE 100, example embodiments of inventive concepts are not limited thereto. It is to be understood that the binary vector BV may be generated by not only the ATE 100 but also various devices and/or software and may be provided to the test controller 210.

Figure 3:
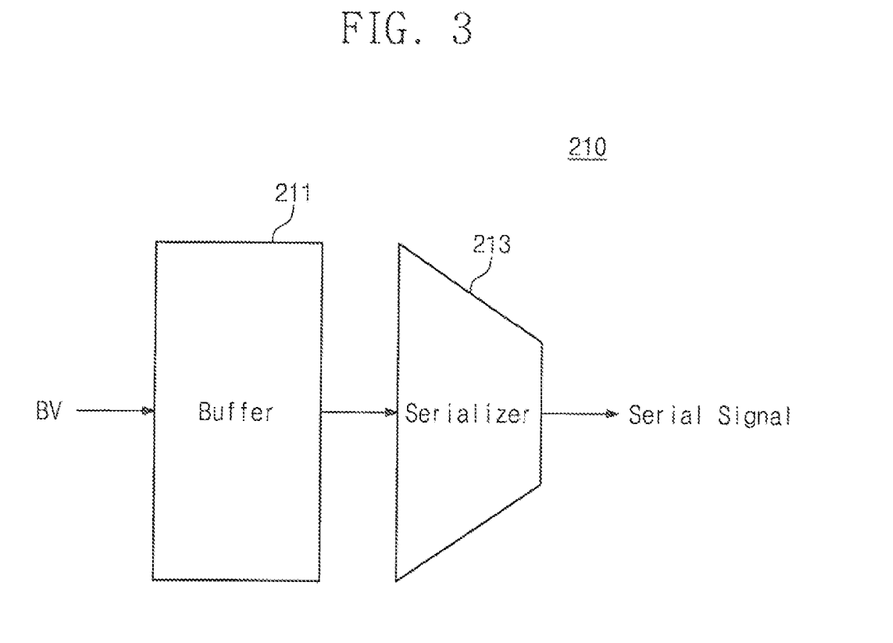
FIG. 3 is a block diagram illustrating the configuration of a test controller according to example embodiments of the inventive concepts.

FIG. 3 is a block diagram illustrating the configuration of the test controller 210 according to example embodiments of the inventive concepts. As illustrated, the test controller 210 may include a buffer 211 and a serializer 213.

The buffer 211 stores a binary vector BV provided from the ATE 100. For example, the buffer 211 may store the binary sequences BC7C, BC07 . . . , DC3C, BD7C, BCC3 . . . , BCC3 . . . , and DC3C received from the ATE 100 and may rearrange the stored binary sequences BC7C, BC07 . . . , DC3C, BD7C, BCC3 . . . , BCC3 . . . , and DC3C in an output sequence corresponding to a first interface 215.

The serializer 213 serializes the binary sequences BC7C, BC07 . . . , DC3C, DB7C, BCC3 . . . , BCC3 . . . , and DC3C stored in the buffer 211. Although not shown in the drawing, an acceleration function may be added to the serializer 213 to match the serialized binary vector BV with a transmission rate (or data rate) defined in the first interface 215.

The test controller 210 is not provided with a function, such as a transaction layer or a link layer of an interface protocol, applied to the DUT 230 (see FIG. 1). However, the test controller 210 buffers an externally provided binary vector BV and transmits the buffered binary vector BV to the DUT 230 according to a signal transmission condition of a physical layer. For this reason, the test board 200 may not include functions of some layers of the interface protocol. Thus, the test board 200 may be relatively free from limitations imposed by layers of the interface protocol.

Figure 4:
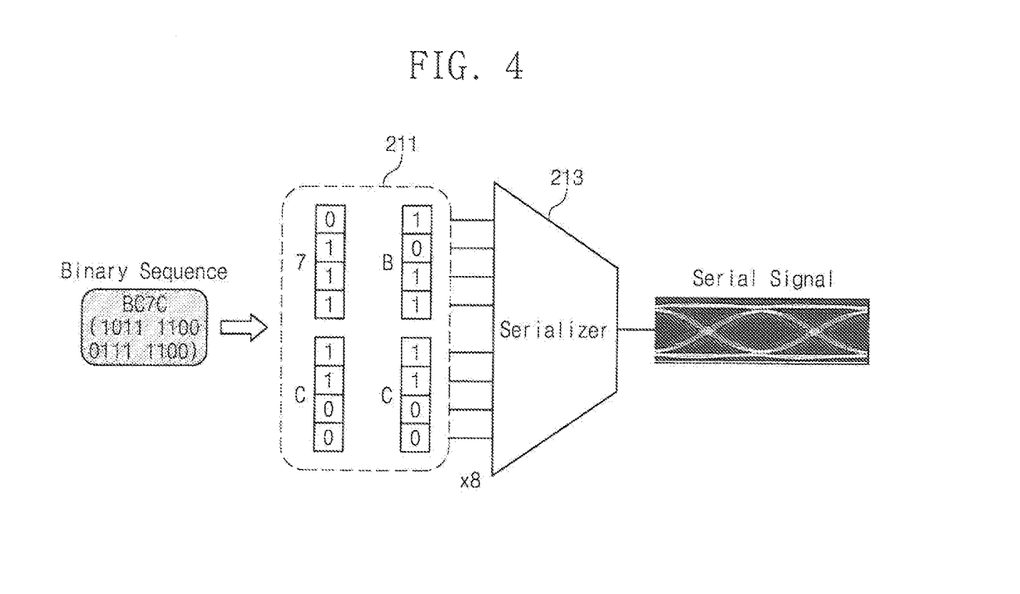
FIG. 4 illustrates a procedure of buffering and serializing performed in the test controller of FIG. 3.

FIG. 4 illustrates a procedure of buffering and serializing performed in the test controller 210 in FIG. 3 according to example embodiments of the inventive concepts. A procedure of transmitting a single data unit BC7C of a binary vector BV as a binary signal will now be described with reference to FIG. 4.

A binary vector BC7C may be provided to the test controller 210 as binary values 1011, 1100, 0111, and 1100. The binary values 1011, 1100, 0111, and 1100 are stored in the buffer 211. The binary values 1011, 1100, 0111, and 1100 stored in the buffer 211 are output as a serial signal by the serializer 213 that converts 8-bit unit data into a sequential binary sequence. The serializer 213 may be further provided with an acceleration function to transmit the serial signal at high speed.

Figure 5:
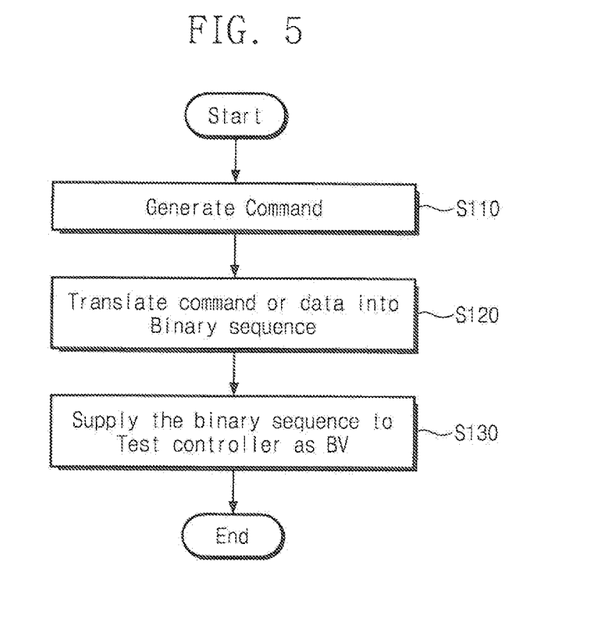
FIG. 5 is a flowchart illustrating a method of generating a binary vector according to example embodiments of the inventive concepts.

FIG. 5 is a flowchart illustrating a method of generating a binary vector according to example embodiments of the inventive concepts. Referring to FIG. 5, the ATE 100 provides a command or data to be transmitted to the test board 200 as a binary vector BV.

In S110, the ATE 100 may generate a command or data for test. The command and/or data for the test may be generated by the ATE 100 or received from a user according to a test schedule.

In S120, the ATE 100 translates the command or the data into a binary sequence. This operation may correspond to, for example, a link layer in a UFS interface protocol.

In S130, the ATE 100 transmits the command or the data translated into the binary sequence to the test controller 210 as a binary vector BV. The binary vector BV may be received in the test controller 210 and may be transmitted to the DUT 230 as a serial signal without being encoded or processed.

The ATE 100 transmits the command or the data to the test controller 210 by processing an operation performed in a transaction layer or a link layer in advance. The test controller 210 may not have a function to translate the command or the data according to an interface protocol. Thus, universality of the test board, which is typically limited by the function to translate the command or the data according to the interface protocol, may be achieved.

Figure 6:
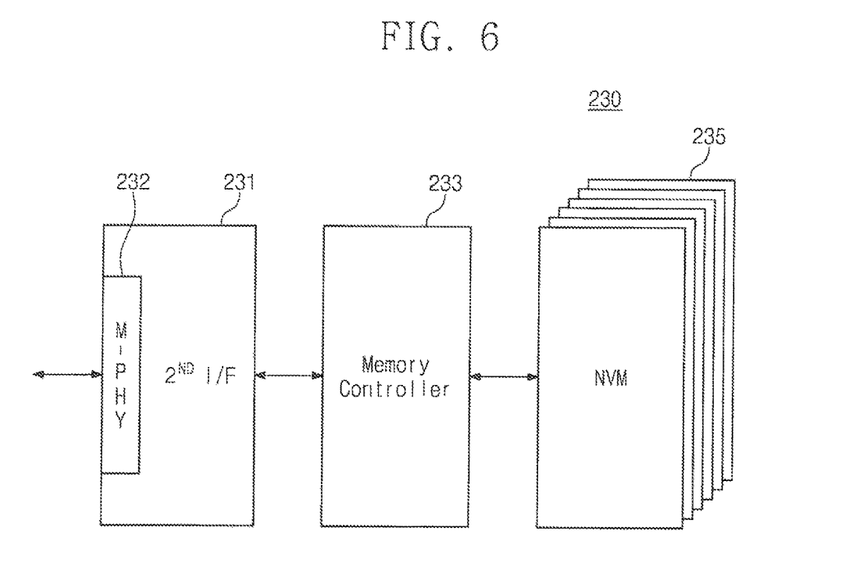
FIG. 6 is a block diagram of a device under test according to example embodiments of the inventive concepts.

FIG. 6 is a block diagram of a device under test (DUT) 230 according to example embodiments of the inventive concepts. As illustrated, the DUT 230 may include an interface 231, a memory controller 233, and a nonvolatile memory device 235.

The interface 231 receives a serial signal provided from the test controller 210. A binary vector BV may be recovered from the received serial signal. For example, the recovery of the binary vector BV in a physical layer may be carried out in an M-PHY 232 constituting the physical layer. The binary vector BV recovered in the interface 231 as a binary signal may be converted into a data format corresponding to the memory controller 233.

The memory controller 233 performs an operation requested in the ATE 100 through the binary vector BV. The memory controller 233 may be configured to control the nonvolatile memory device 235 in response to the request of the ATE 100. The memory controller 233 interfaces the ATE 100 with the nonvolatile memory device 235. The memory controller 233 controls the nonvolatile memory device 235 to write data in response to a write request of the ATE 100. The memory controller 233 controls a read operation of the nonvolatile memory device 235 in response to a read command from the ATE 100.

The memory controller 233 may drive software (or firmware), which may be called a flash transfer layer (hereinafter referred to as "FTL"), to control the nonvolatile memory device 235. The FTL provides an interface to conceal an erase operation of the nonvolatile memory device 235 between a file system of a host and the nonvolatile memory device 235. Aspects of the nonvolatile memory device 235, such as erase-before-write and a mismatch between erase and write units, may be complemented by the FTL. In addition, the FTL maps a logical address LA generated by the file system onto a physical address PA of the nonvolatile memory device 235 during a write operation of the nonvolatile memory device 235.

The nonvolatile memory device 235 performs erase, read, and write operations according to the control of the memory controller 233. The nonvolatile memory device 235 may include a plurality of memory blocks, and each of the memory blocks may include a plurality of memory cells arranged in a matrix of rows and columns. Each of the memory cells may be arranged to have a two-dimensional array structure or a three-dimensional (or vertical) array structure.

The nonvolatile memory device 235 may include a plurality of memory blocks BLK1 to BLKi. Each of the memory blocks BLKi to BLKi constitutes a single erase unit. Each of the memory blocks BLK1 to BLKi may include a plurality of memory cells stacked in a direction perpendicular to a substrate to constitute a cell string. Alternatively, each of the memory blocks BLK1 to BLKi may be provided in the form where a plurality of cell strings are stacked in a direction parallel to the substrate. Capacity of a single memory block continues to significantly increase due to the memory blocks BLK1 to BLKi formed to have the foregoing three-dimensional structure. An example will be described where a NAND flash memory is used as a storage medium of the nonvolatile memory device 235. However, other nonvolatile memory devices may be used as storage media. For example, PRAM, MRAM, ReRAM, FRAM, and NOR flash memory may be used as storage media and may be applied to a hybrid memory system in which different types of memory devices are used together.

A storage device including a nonvolatile memory device has been described as an example of the device under test (DUT) 230. However, it is to be understood that the DUT 230 may be not only a memory device but also an application processor (AP) applying one of a variety of interface protocols, a system-on-chip or a memory card.

Figure 7:
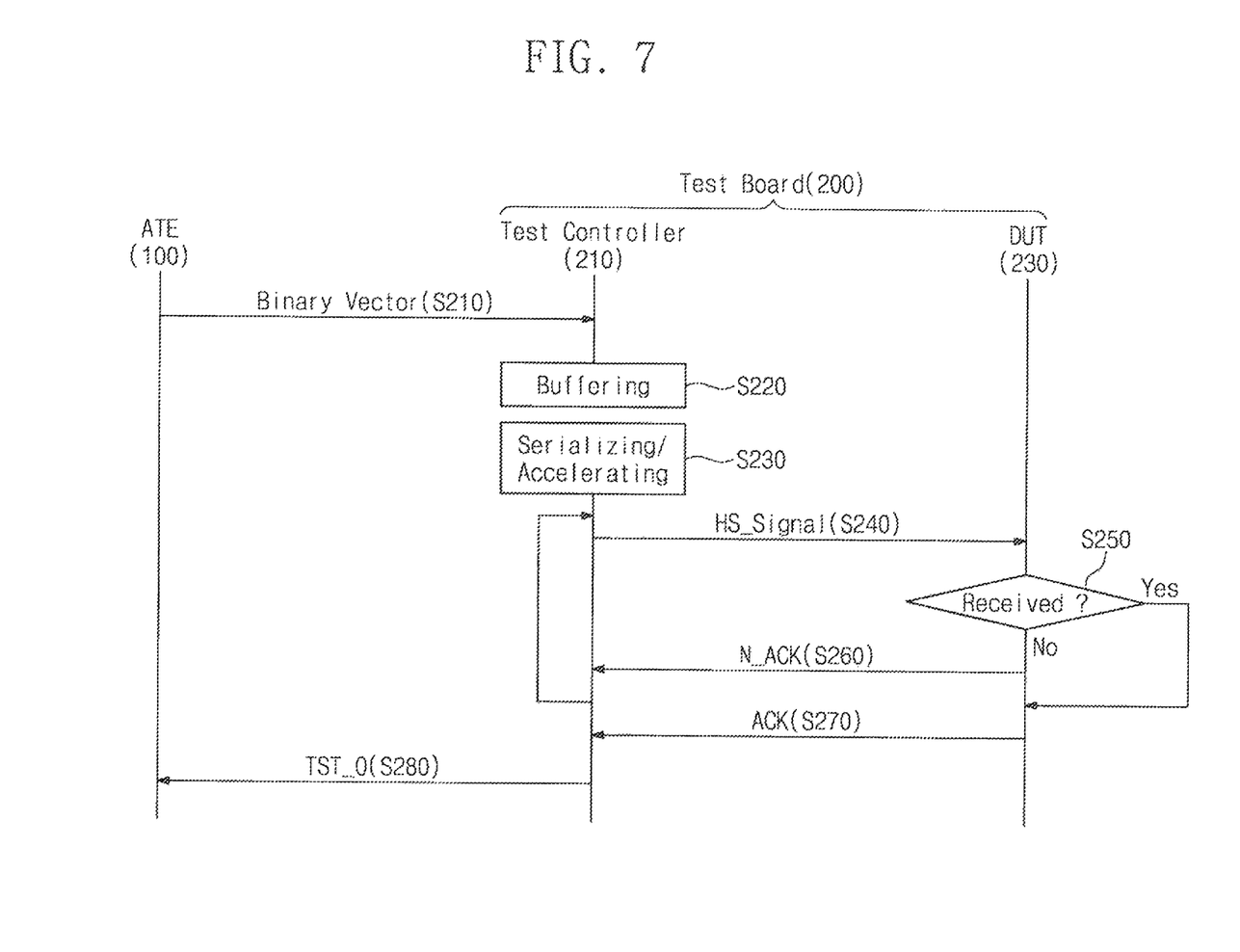
FIG. 7 illustrates a test system according to example embodiments of the inventive concepts.

FIG. 7 illustrates a test system 200 according to example embodiments of the inventive concepts. Referring to FIG. 7, the test system 200 may receive a binary vector BV to perform a test operation on a device under test (DUT) 230.

In S210, an ATE 100 transfers the binary vector BV to a test controller 210. The binary vector BV is determined according to an interface protocol between the test controller 210 and the DUT 230. The binary vector BV may be generated in the ATE 100 and is not to be limited to the type of an interface protocol of the DUT 230.

In S220, the test controller 210 stores the binary vector BV transferred from the ATE 100. For example, the test controller 210 stores the binary vector BV in a buffer 211.

In S230, the test controller 210 aligns an output order to convert the binary vector BV stored in the buffer 211 into a serial signal. The alignment method has been described above with respect to FIG. 4. The test controller 210 accelerates the binary vector BV stored in the buffer 211 for serial transfer of the binary vector BV.

In S240, the test controller 210 transmits a binary vector HS_Signal converted into a high-speed serial signal to the DUT 230.

In S250, the DUT 230 checks whether the binary vector HS_Signal transmitted as a serial signal is received. The DUT 230 converts the binary vector HS_Signal as a serial signal into binary data. The DUT 230 performs an error check operation on the binary vector BV converted to a binary form.

In S260, when the binary vector BV is not determined to be received without error through the error check operation, the DUT 230 may transmit a receive error message N_ACK to the test controller 210. Then, the test controller 210 may retransmit the binary vector HS_Signal transmitted as a serial signal.

In S270, when the binary vector BV is determined to be received without error through the error check operation, the DUT 230 transmits a receive end signal ACK to the test controller 210.

In S280, the test controller 210 may transfer a transfer result of the binary vector BV or a test result TST_O to the ATE 100.

The procedure of transferring the binary vector BV to the DUT 230 has been described above. The binary vector BV is generated in the ATE 100 according to an interface protocol between the test controller 210 and the DUT 230. Thus, the test controller 210 may transfer the binary vector BV provided from the ATE 100 to the DUT 230. Due to the above-described structure, the test controller 210 need not perform a transaction layer or link layer function of the interface protocol of the DUT 230. This is because an operation function of the interface protocol may be carried out in the ATE 100. Thus, the test board 200 may provide universality that is substantially independent of the type of an interface protocol used by the DUT 230.

Figure 8:
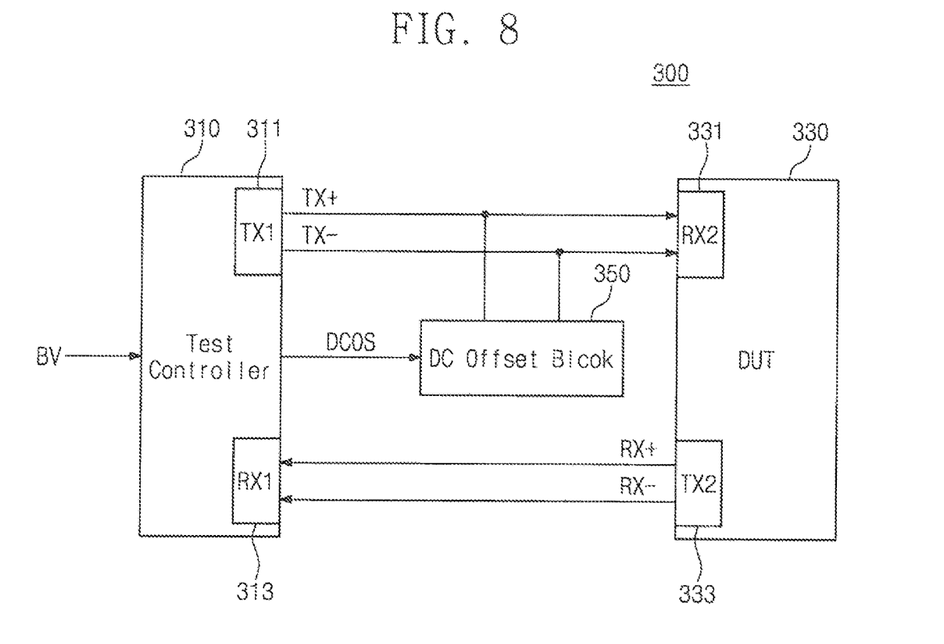
FIG. 8 is a block diagram of a test board according to example embodiments of the inventive concepts.

FIG. 8 is a block diagram of a test board 300 according to example embodiments of the inventive concepts. As illustrated, the test board 300 includes a test controller 310, a device under test (DUT) 330, and a DC offset block 350. Because the DUT 330 is substantially identical to that described in FIG. 1, detailed functions of the DUT 330 will not be described below.

The test controller 310 may externally receive a binary vector BV and store the received binary vector BV in a buffer. The test controller 310 may convert the binary vector BV stored in the buffer into a serial signal and accelerate and transmit the serial signal to the DUT 330. The test controller 310 may include a first transmitter circuit (TX1) 311 for signal transmission to the DUT 330 and a first receiver circuit (RX1) 313 for signal reception. The first transmitter circuit 311 and the first receiver circuit 313 may constitute a single lane. The first transmitter circuit 311 transmits a differential signal to differential signal lines TX+ and TX−. The first receiver circuit 313 receives the differential signal through differential signal lines RX+ and RX−. The test controller 310 may provide a DC offset control signal DCOS to a DC offset block 350 when transmitting data through the first transmitter circuit 311. The DC offset control signal DCOS may be adjusted according to an operation mode of the DUT 330 or an interface protocol of the DUT 330.

The DUT 330 receives the binary vector BV from the test controller 310 using a second receiver circuit (RX2) 331. The DUT 330 converts and processes the received binary vector BV according to an interface protocol. The DUT 330 transfers the processing result or requested data to the test controller 310 through a second transmitter circuit (TX2) 333. The second receiver circuit 331 may be connected to the first transmitter circuit 311 through the differential signal lines TX+ and TX−. The second transmitter circuit 333 may be connected to the first receiver circuit 313 through the differential signal lines RX+ and RX−.

The DC offset block 350 receives the DC offset control signal provided from the test controller 310. The DC offset block 350 controls a DC offset of the differential signal lines TX+ and TX− between the test controller 310 and the DUT 330. The DC offset block 350 may vary the DC offset of the differential signal lines TX+ and TX− based on the DC offset control signal DCOS. The DC offset block 350 may be implemented using passive elements to provide the DC offset.

For example, the DC offset block 350 may adjust a DC offset according to an operation mode. When the first transmitter circuit 311 is in a hibernate state, the DC offset block 350 may provide the DC offset as a voltage of 0 volts. When the first transmitter circuit 311 transitions from the hibernate state to a wakeup state for transmitting data or is in a burst state for transmitting data, the DC offset block 350 increases the DC offset to a predetermined level.

In addition, the DC offset block 350 may adjust the DC offset according to an interface protocol. The DC offset block 350 for interfacing various types of DUTs 330 using a serial interface may adjust a serial offset of the differential signal lines TX+ and TX− to various levels.

Figure 9:
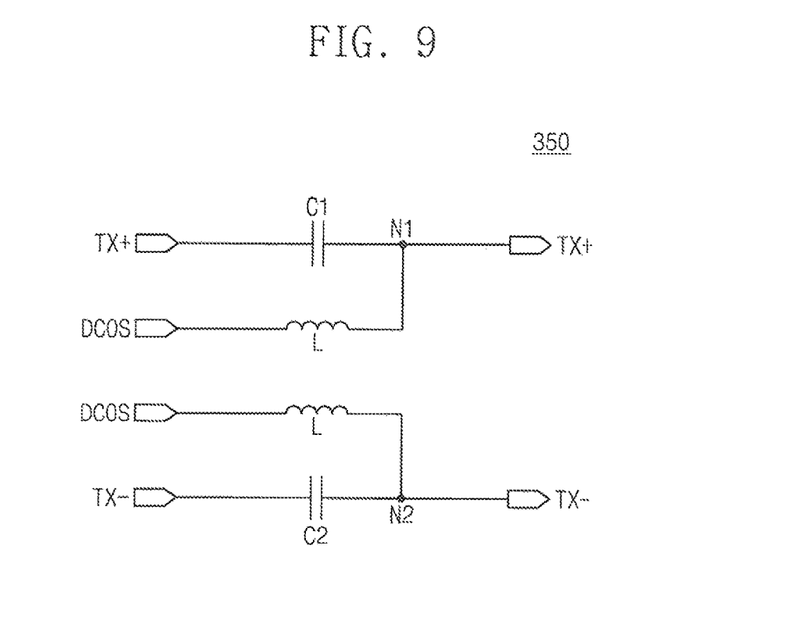
FIG. 9 is a circuit diagram illustrating an example of a DC offset block of FIG. 8.

FIG. 9 is a circuit diagram illustrating an example of the DC offset block 350 in FIG. 8. Referring to FIG. 9, an inductor L providing a DC offset corresponding to a DC offset control signal DCOS may be connected to each of the differential signal lines TX+ and TX−.

A differential signal line between the first transmitter circuit 311 and the second receiver circuit 331 is connected to the differential signal lines TX+ and TX− by coupling capacitors C1 and C2. Each of nodes N1 and N2 is provided with a DC offset according to a level of the DC offset control signal DCOS provided to one end of the inductor L. The level of the DC offset control signal DCOS is the DC offset.

Figure 10:
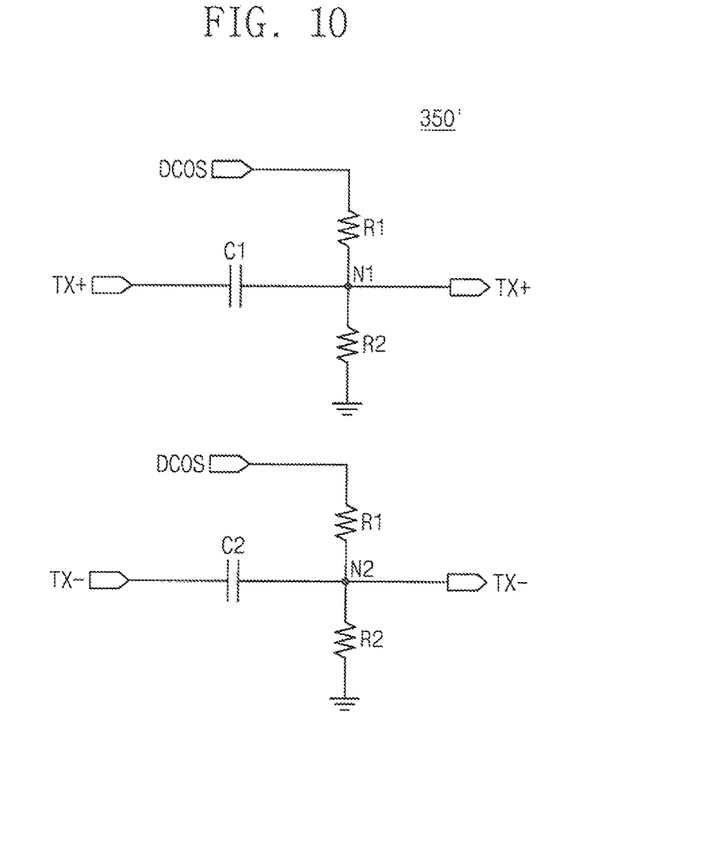
FIG. 10 is a circuit diagram illustrating another example of a DC offset block of FIG. 8.

FIG. 10 is a circuit diagram illustrating another example of the DC offset block 350 in FIG. 8. Referring to FIG. 10, divided resistors R1 and R2 may be connected to the differential signal lines TX+ and TX− to divide the DC offset control signal DCOS and provide the divided DC offset control signal DCOS as the DC offset, respectively.

A differential signal line between the first transmitter circuit 311 and the second receiver circuit 331 is connected to each of the differential signal lines TX+ and TX− by coupling capacitors C1 and C2. Divided resistors R1 and R2 may be connected to nodes N1 and N2, respectively. A divided voltage of the DC offset control signal DCOS may be provided to each of first and second nodes N1 and N2 as the DC offset.

Example embodiments of the DC offset block 350 providing the DC offset to the differential signal lines TX+ and TX− using a passive element have been described. The above-structured DC offset block 350 may be implemented on a substrate comprising the test board 300.

Figure 11:
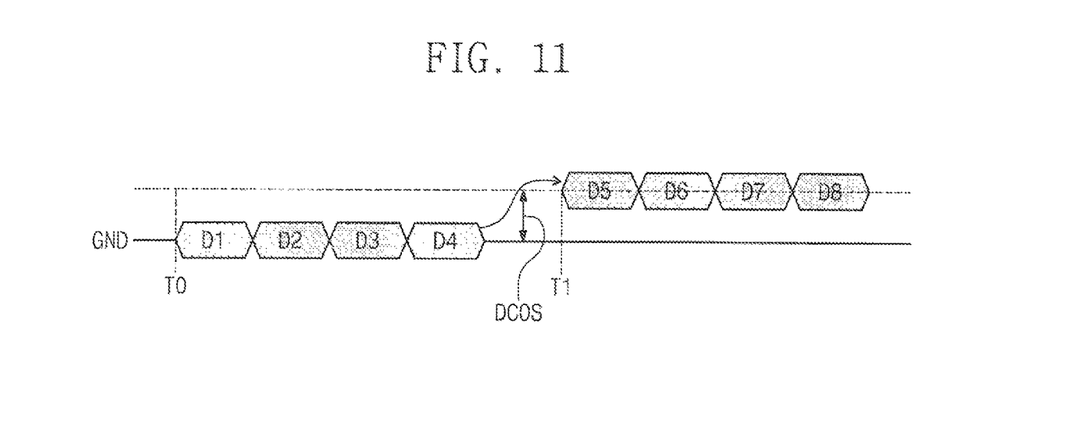
FIG. 11 is a timing diagram illustrating signal level variation of a differential signal line depending on provision of a DC offset according to example embodiments of the inventive concepts.

FIG. 11 is a timing diagram illustrating signal level variation of a differential signal line based on provision of a DC offset according to example embodiments of the inventive concepts. Referring to FIG. 11, a DC offset of a signal transmitted to differential signal lines TX+ and TX− may vary based on a DC offset control signal DCOS.

For example, at a time point T0, serial signals D1, D2, D3, and D4 may be transmitted through the differential signal lines TX+ and TX−. This point will be assumed to be a time point at which the DC offset control signal DCOS is provided as at a voltage of 0 volts.

At a time point T1, the DC offset control signal DCOS may be enabled by the test controller 310. In this case, the DC offset of the differential signal lines TX+ and TX− is provided through an inductance L or divided resistors R1 and R2. Thus, serial signals D5, D6, D7, and D8 may change to a level corresponding to the DC offset.

It is to be understood that the DC offset control signal DCOS may be provided with various values according to an interface protocol or an operation mode.

Figure 12:
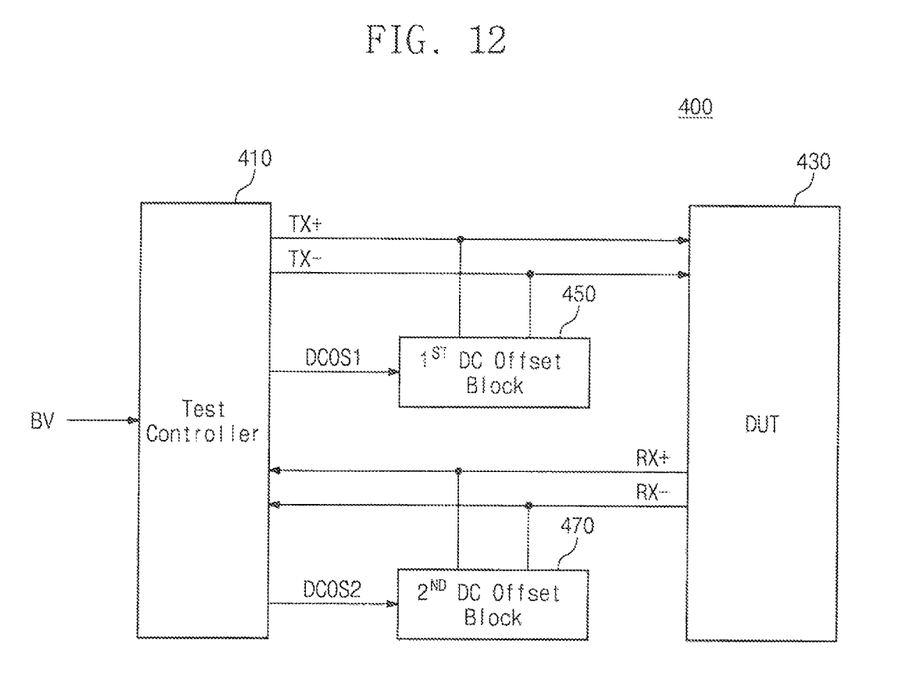
FIG. 12 is a block diagram of a test board according to example embodiments of the inventive concepts.

FIG. 12 is a block diagram of a test board 400 according to example embodiments of the inventive concepts. As illustrated, the test board 400 includes a test controller 410, a device under test (DUT) 430, a first DC offset block 450, and a second DC offset block 470. Because the DUT 430 is substantially identical to that described with respect to FIG. 8, detailed description of the DUT 430 will be omitted below.

The test controller 410 may externally receive a binary vector BV and store the received binary vector BV in a buffer. The test controller 410 may convert the binary vector BV stored in the buffer into a serial signal and accelerate and transmit the serial signal to the DUT 430. The test controller 410 transmits the serial signal to the DUT 430 using differential signal lines TX+ and TX−. The test controller 410 receives a differential signal from the DUT 430 through differential signal lines RX+ and RX−.

The test controller 410 may control a DC offset of the differential signal lines TX+ and TX− using a first DC offset control signal DCOS1 when transmitting data through the differential signal lines TX+ and TX−. The test controller 410 may control the first DC offset block 450 via the first DC offset control signal DCOS1.

Additionally, the test controller 410 may control a DC offset of the differential signal lines RX+ and RX− using a second DC offset control signal DCOS2 when receiving data through the differential signal lines RX+ and RX−. The test controller 410 may control the second DC offset block 470 via the second DC offset control signal DCOS2.

According to the above-described embodiments of inventive concepts, the test controller 410 may receive a binary vector BV and transmit the received binary vector BV to the DUT 430. Additionally, the test controller 410 may independently control a DC offset for a transmission differential signal and a reception differential signal.

When the above-described test board 400 is used, a design of the test controller 410 need not be changed according to an interface protocol of the DUT 430. Thus, high universality may be provided.

As described above, a test apparatus capable of testing semiconductor devices of various interface protocols may be implemented.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A test apparatus comprising:
   a device under test (DUT) configured to exchange data using a serial interface protocol; and
   a test controller configured to receive a binary vector corresponding to a physical layer of the serial interface protocol from an external device and to buffer and transmit the received binary vector to the DUT,
   wherein the test controller further comprises a DC offset block configured to transmit the binary vector to the DUT through at least one differential signal line pair and to adjust a DC offset in the at least one differential signal line pair.

2. The test apparatus as set forth in claim 1, wherein the test controller comprises:
   a buffer configured to store the binary vector; and
   a serializer configured to convert the binary vector that was stored into a serial signal corresponding to the serial interface protocol.

3. The test apparatus as set forth in claim 2, wherein the serializer is further configured to convert the binary vector into a differential signal corresponding to the serial interface protocol and accelerates and output data.

4. The test apparatus as set forth in claim 1, wherein the binary vector is a sequence of a binary signal received via a differential signal in the physical layer of the serial interface protocol.

5. The test apparatus as set forth in claim 1, wherein the DC offset block comprises at least one passive element configured to apply the DC offset to the differential signal line in response to a DC offset control signal provided from the test controller.

6. A general-purpose test apparatus comprising:
a test controller configured to translate received binary data into a serial transmission signal;
a device under test (DUT) configured to receive the serial transmission signal from the test controller via a differential signal line pair; and
a DC offset block configured to adjust a DC offset of the differential signal line pair in response to a DC offset control signal from the test controller,
wherein the DC offset block comprises at least one passive element.

7. The general-purpose test apparatus as set forth in claim 6, wherein the test controller is further configured to generate the DC offset control signal based on a type of an interface protocol of the DUT.

8. The general-purpose test apparatus as set forth in claim 6, wherein the test controller is further configured to determine a level of the DC offset control signal based on an operation mode of the DUT.

9. The general-purpose test apparatus as set forth in claim 6, wherein the DC offset block comprises an inductor configured to receive the DC offset control signal and to provide the DC offset control signal as a DC offset of at least one line among the differential signal line pair.

10. The general-purpose test apparatus as set forth in claim 6, wherein the DC offset block comprises a plurality of divided resistors configured to divide the DC offset control signal and provide the divided DC offset control signal as a DC offset of at least one line among the differential signal line pair.

11. A test apparatus, comprising:
a test controller that is configured to communicate with a device under test (DUT) using a multi-layer test protocol; and
an automated test equipment unit that is coupled to the test controller;
wherein the automated test equipment unit is configured to implement at least one layer of the multi-layer test protocol and the test controller is configured to implement remaining layers of the multi-layer test protocol other than the at least one layer of the multi-layer test protocol implemented by the automated test equipment;
wherein the automated test equipment unit is further configured to translate a command for a device under test into a binary vector that corresponds to a physical layer of the multi-layer test protocol; and
wherein the physical layer of the multi-layer test protocol is defined by an M-PHY specification.

12. The test apparatus of claim 11,
wherein the test controller comprises:
a buffer configured to store the binary vector received from the automated test equipment unit; and
a serializer configured to convert the binary vector into a serial signal corresponding to a serial interface protocol for communication to the DUT.

13. The test apparatus of claim 12, wherein the serializer is configured to accelerate a data rate of the serial signal to match a transmission rate of a link between the test controller and the DUT.

14. The test apparatus of claim 11, wherein the at least one layer of the multi-layer test protocol comprises at least one of a link layer of the multi-layer test protocol and a transaction layer of the multi-layer test protocol.

15. The test apparatus of claim 11, wherein the multi-layer test protocol is one of a Peripheral Component Interconnect Express (PCIe) protocol, a Universal Flash Storage (UFS) protocol, and a Next Generation Form Factor (M.2) protocol.

* * * * *